United States Patent
Maeno et al.

(10) Patent No.: US 10,627,063 B2
(45) Date of Patent: Apr. 21, 2020

(54) LIGHT SOURCE MODULE AND VEHICLE LAMP, HAVING WAVELENGTH CONVERSION MEMBER DISPOSED IN OPTICAL PATHS OF FIRST AND SECOND LIGHT-EMITTING ELEMENTS

(71) Applicant: Koito Manufacturing Co., Ltd, Tokyo (JP)

(72) Inventors: Yuzo Maeno, Shizuoka (JP); Tsukasa Tokida, Shizuoka (JP); Shinpei Maeda, Shizuoka (JP); Hidemichi Sone, Shizuoka (JP)

(73) Assignee: KOITO MANUFACTURING CO., LTD., Minato-Ku, Tokyo (JP)

( * ) Notice: Subject to any disclaimer, the term of this patent is extended or adjusted under 35 U.S.C. 154(b) by 7 days.

(21) Appl. No.: 15/977,919

(22) Filed: May 11, 2018

(65) Prior Publication Data
US 2018/0266639 A1    Sep. 20, 2018

Related U.S. Application Data

(63) Continuation of application No. PCT/JP2016/082916, filed on Nov. 7, 2016.

(30) Foreign Application Priority Data

Nov. 12, 2015 (JP) ................................. 2015-222340
Nov. 13, 2015 (JP) ................................. 2015-223310

(51) Int. Cl.
*F21S 41/125* (2018.01)
*F21S 41/141* (2018.01)
(Continued)

(52) U.S. Cl.
CPC ............ *F21S 41/125* (2018.01); *B60Q 1/085* (2013.01); *F21S 41/00* (2018.01); *F21S 41/141* (2018.01);
(Continued)

(58) Field of Classification Search
CPC .. F21S 41/00; F21S 41/10; F21S 41/12; F21S 41/125; F21S 41/14; F21S 41/141;
(Continued)

(56) References Cited

U.S. PATENT DOCUMENTS 8,203,260 B2 * 6/2012 Li .................... H05B 33/086
                                                                313/502
2007/0045524 A1 * 3/2007 Rains, Jr. .................. F21S 2/00
                                                                250/228

(Continued)

FOREIGN PATENT DOCUMENTS

CN       102959325 A     3/2013
JP       2004288760 A    10/2004
(Continued)

OTHER PUBLICATIONS

Minato et al., "White Light Source", Jan. 15, 2009, Dialog.Proquest. com, Machine English translation of JP 200910013 A, pp. 1-10.*

(Continued)

*Primary Examiner* — Alan B Cariaso
(74) *Attorney, Agent, or Firm* — Buchanan Ingersoll & Rooney PC

(57) ABSTRACT

A light source module includes first LED elements that emit blue light, second LED elements that emit amber light, and a wavelength conversion member disposed in optical paths of the first LED elements and the second LED elements. The wavelength conversion member converts a portion of the blue light emitted by the first LED elements to yellow light, transmits a portion of the blue light emitted by the first LED elements, and substantially transmits the amber light emitted by the second LED elements.

10 Claims, 12 Drawing Sheets

(51) Int. Cl.
*H01L 25/075* (2006.01)
*B60Q 1/08* (2006.01)
*F21S 41/00* (2018.01)
*G02B 5/02* (2006.01)
*H05B 33/08* (2020.01)
*H01L 33/50* (2010.01)
*F21V 9/38* (2018.01)

(52) U.S. Cl.
CPC ........ *G02B 5/0205* (2013.01); *H01L 25/0753* (2013.01); *H05B 33/0845* (2013.01); *H05B 33/0857* (2013.01); *B60Q 2300/312* (2013.01); *F21V 9/38* (2018.02); *H01L 33/50* (2013.01)

(58) Field of Classification Search
CPC .............. G02B 5/0205; H05B 33/0845; H05B 33/0857; F21V 9/38
See application file for complete search history.

(56) References Cited

U.S. PATENT DOCUMENTS

| | | |
|---|---|---|
| 2009/0194774 A1 | 8/2009 | Huang et al. |
| 2012/0155076 A1* | 6/2012 | Li ........................ F21S 8/026 362/231 |
| 2013/0003403 A1* | 1/2013 | Takahira ............. B60Q 1/0023 362/538 |

FOREIGN PATENT DOCUMENTS

| | | |
|---|---|---|
| JP | 200780880 A | 3/2007 |
| JP | 200910013 A | 1/2009 |
| JP | 2010524255 A | 7/2010 |
| JP | 2012169189 A | 9/2012 |
| JP | 2013140724 A | 7/2013 |
| JP | 2013531376 A | 8/2013 |
| JP | 2013203762 A | 10/2013 |
| JP | 2014186897 A | 10/2014 |
| WO | 2011163240 A1 | 12/2011 |

OTHER PUBLICATIONS

Eiji Shiohama, "Light Emitting Device", Mar. 29, 2007, Dialog. Proquest.com, Machine English translation of JP 2007080880 A, pp. 1-5.*
Ping-Yu Chen, "Headlight System for Vehicle", Jul. 18, 2013, Espacenet, English translation of JP2013140724 A, pp. 1-5.*
International Search Report dated Jan. 24, 2017 for the corresponding PCT Application No. PCT/JP2016/082916.
International Preliminary Examination Report on Patentability (I) with Written Opinion of ISA dated May 15, 2018 regarding corresponding PCT Application No. PCT/JP2016/082916.
Official Action dated Oct. 10, 2019 in corresponding European Patent Application No. 16864145.4, 14 pages.
First Office Action dated Dec. 26, 2019 in corresponding Chinese Patent Application No. 201680065668.1 with English Translation, 18 pages.
Extended European Search Report dated Jan. 16, 2020 in corresponding European Patent Application No. 16864145.4, 12 pages.

* cited by examiner

LIGHT SOURCE MODULE AND VEHICLE LAMP, HAVING WAVELENGTH CONVERSION MEMBER DISPOSED IN OPTICAL PATHS OF FIRST AND SECOND LIGHT-EMITTING ELEMENTS

CROSS-REFERENCE TO RELATED APPLICATIONS

This application is based upon and claims the benefit of priority from prior Japanese Patent Application No. 2015-222340, filed on Nov. 12, 2015, Japanese Patent Application No. 2015-223310, filed on Nov. 13, 2015, and International Patent Application No. PCT/JP2016/082916, filed on Nov. 7, 2016, the entire content of each of which is incorporated herein by reference.

BACKGROUND OF THE INVENTION

1. Field of the Invention

The present invention relates to light source modules and vehicle lamps.

2. Description of the Related Art

In recent years, the development of vehicle lamps that include light-emitting elements as light sources is in progress. To date, for example, a light source module in which a plurality of light-emitting elements are arranged in a matrix and a vehicle lamp that includes such a light source module have been proposed (e.g., Japanese Patent Application Publication No. 2012-169189).

In an existing light source module for a vehicle lamp such as the one described in Japanese Patent Application Publication No. 2012-169189, the correlated color temperature of irradiation light from the light source module is fixed, and the correlated color temperature cannot be adjusted to an optimal correlated color temperature in accordance with the driver's vision, the traveling conditions, and so on, for example.

SUMMARY OF THE INVENTION

The present invention has been made to address such an issue and is directed to providing a light source module and a vehicle lamp capable of having the correlated color temperature adjusted.

To solve the above problem, a light source module according to an aspect of the present invention includes a first light-emitting element that emits light having a dominant wavelength in a first wavelength range, a second light-emitting element that emits light having a dominant wavelength in a second wavelength range, and a wavelength conversion member disposed in optical paths of the first light-emitting element and the second light-emitting element. The wavelength conversion member converts a portion of the light having a dominant wavelength in the first wavelength range emitted by the first light-emitting element to light having a dominant wavelength in a third wavelength range, transmits a portion of the light having a dominant wavelength in the first wavelength range emitted by the first light-emitting element, and substantially transmits the light having a dominant wavelength in the second wavelength range emitted by the second light-emitting element.

Another aspect of the present invention provides a light source module for a vehicle lamp. This light source module for a vehicle lamp includes a first light source and a second light source that emits light at a correlated color temperature different from that of the first light source.

It is to be noted that any optional combination of the above constituent elements or an embodiment obtained by replacing the constituent elements of the present invention or what is expressed by the present invention among a method, an apparatus, a system, and so on is also effective as an embodiment of the present invention.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which.

DETAILED DESCRIPTION OF THE INVENTION

Figure 1:
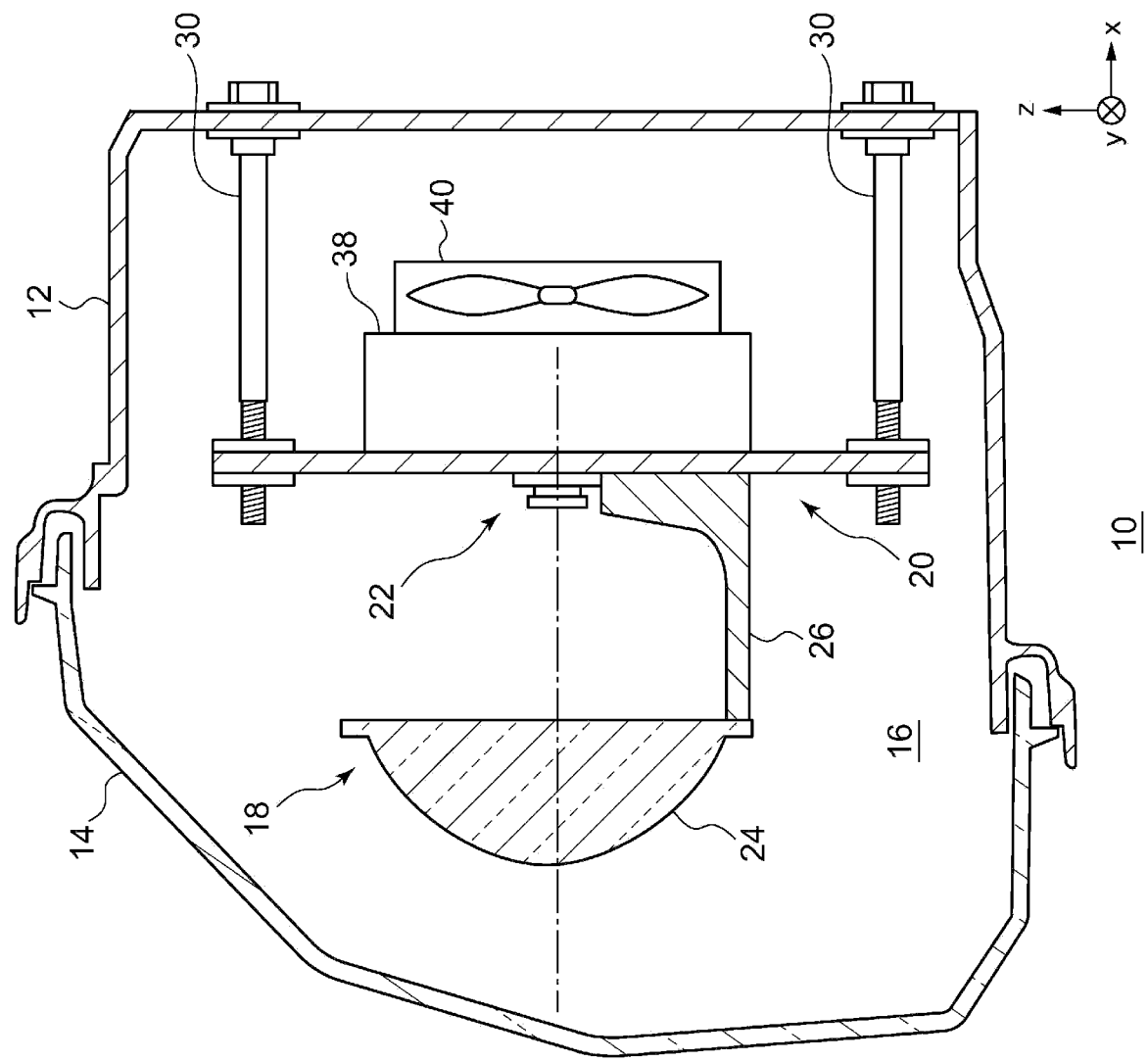
FIG. 1 is a sectional view illustrating a configuration of a vehicle lamp according to a first embodiment.

A light source module according to an aspect of the present invention includes a first light-emitting element that emits light having a dominant wavelength in a first wavelength range, a second light-emitting element that emits light having a dominant wavelength in a second wavelength range, and a wavelength conversion member disposed in optical paths of the first light-emitting element and the second light-emitting element. The wavelength conversion member converts a portion of the light having a dominant wavelength in the first wavelength range emitted by the first light-emitting element to light having a dominant wavelength in a third wavelength range, transmits a portion of the light having a dominant wavelength in the first wavelength range emitted by the first light-emitting element, and substantially transmits the light having a dominant wavelength in the second wavelength range emitted by the second light-emitting element.

According to this aspect, by individually controlling the first light-emitting element and the second light-emitting element, the correlated color temperature of combined light including the light having a dominant wavelength in the first wavelength range, the light having a dominant wavelength in the second wavelength range, and the light having a dominant wavelength in the third wavelength range can be adjusted.

The wavelength conversion member may include a component having a refractive index different from that of the wavelength conversion member. In this case, the luminance unevenness and the color unevenness of the combined light can be reduced.

The first light-emitting element and the second light-emitting element may be disposed on the same substrate.

The first light-emitting element and the second light-emitting element may be arrayed side by side, and an interval between the first light-emitting element and the second light-emitting element may be no greater than one-half a smaller one of a width of the first light-emitting element in an array direction in which the first light-emitting element and the second light-emitting element are arrayed and a width of the second light-emitting element in the array direction. In this case, the luminance unevenness and the color unevenness of the combined light can be reduced.

Another aspect of the present invention provides a vehicle lamp. This vehicle lamp includes the light source module described above and a driving circuit capable of individually controlling the first light-emitting element and the second light-emitting element of the light source module.

According to this aspect, the correlated color temperature of the combined light including the light having a dominant wavelength in the first wavelength range, the light having a dominant wavelength in the second wavelength range, and the light having a dominant wavelength in the third wavelength range can be adjusted.

Another aspect of the present invention provides a light source module for a vehicle lamp. This light source module for a vehicle lamp includes a first light source and a second light source that emits light at a correlated color temperature different from that of the first light source.

According to this aspect, by individually controlling the first light source and the second light source, the correlated color temperature of the combined light including the light from the first light source and the light from the second light source can be adjusted.

The first light source may include a first light-emitting element and a first wavelength conversion member that is disposed in an optical path of the first light-emitting element, that converts a wavelength of a portion of light emitted by the first light-emitting element, and that transmits a portion of the light emitted by the first light-emitting element, and may emit white light that is based on the light having the wavelength converted by the first wavelength conversion member and the light transmitted through the first wavelength conversion member.

The second light source may include a second light-emitting element and a second wavelength conversion member that is disposed in an optical path of the second light-emitting element, that converts a wavelength of a portion of light emitted by the second light-emitting element, and that transmits a portion of the light emitted by the second light-emitting element, and may emit white light that is based on the light having the wavelength converted by the second wavelength conversion member and the light transmitted through the second wavelength conversion member. The first wavelength conversion member may include a first phosphor. The second wavelength conversion member may include a second phosphor. The first light-emitting element and the second light-emitting element may emit light having a substantially identical wavelength. There may be a difference between at least one of a composition of the first phosphor and a composition of the second phosphor, a concentration of the first phosphor and a concentration of the second phosphor, and a thickness of the first wavelength conversion member and a thickness of the second wavelength conversion member.

The second light source may include a second light-emitting element and a second wavelength conversion member that is disposed in an optical path of the second light-emitting element, that converts a wavelength of a portion of light emitted by the second light-emitting element, and that transmits a portion of the light emitted by the second light-emitting element, and may emit white light that is based on the light having the wavelength converted by the second wavelength conversion member and the light transmitted through the second wavelength conversion member. The first light-emitting element and the second light-emitting element may emit light having different wavelengths.

The first light source may further include a third light-emitting element that emits light having a wavelength different from that of the first light-emitting element. The first wavelength conversion member may substantially transmit the light emitted by the third light-emitting element.

Hereinafter, the present invention will be described on the basis of exemplary embodiments with reference to the drawings. Identical or equivalent constituent elements, members, and processes illustrated in the drawings are given identical reference characters, and duplicate descriptions thereof will be omitted as appropriate. The embodiments are illustrative in nature and are not intended to limit the invention. Not all the features described in the embodiments and combinations thereof are necessarily essential to the invention. When the terms indicating directions, such as "up," "down," "front," "rear," "left," and "right," are used in the present specification, these terms indicate the directions in a posture held while a vehicle lamp is being mounted in a vehicle.

First, the circumstances that have led to the invention implemented by the embodiments will be described.

Typically, the vision becomes weaker as a person becomes older. Thus, an elderly driver has better visibility when the correlated color temperature of the irradiation light is higher. Even for a younger driver with a weak vision, the visibility improves when the correlated color temperature of the irradiation light is higher.

According to the study by the inventors, the correlated color temperature optimal for irradiation light of a light source module and in turn of a vehicle lamp differs depending on the traveling conditions. Table 1 summarizes the correlated color temperatures optimal for the respective traveling conditions.

TABLE 1

| Traveling Conditions | Optimal Color Temperatures | Reasons |
| --- | --- | --- |
| Traveling in city area | Mid | (1) The color rendering properties tend to be higher as the correlated color temperature of a light source module is lower. A variety of objects to look at are present in a city area, and thus a lower correlated color temperature is more advantageous in terms of the visibility.<br>(2) Among three visual cells S, M, and L present in a cone in an eye, the S cell, having a broader viewing angle, has a higher sensitivity to a short |

TABLE 1-continued

| Traveling Conditions | Optimal Color Temperatures | Reasons |
|---|---|---|
| | | wavelength, and thus a higher correlated color temperature is more advantageous in terms of the visibility. → Due to the above (1) and (2), a preferable correlated color temperature of irradiation light is a mid temperature. |
| Traveling on expressway | High | Typically, a higher correlated color temperature appears brighter to a person. Therefore, increasing the correlated color temperature can improve the visibility at a great distance. |
| Raining | Low | Light with a longer wavelength is less scattered by rain drops, which thus reduces a phenomenon in which rain drops shine and improves the visibility. |
| Short drive | High | The concentration of the driver increases. |
| Long drive | Low | Fatigue is reduced. |

However, in existing light source module and vehicle lamp, the correlated color temperature of the irradiation light is fixed and cannot be adjusted in accordance with the vision of the driver, the traveling conditions, and so on. On the basis of the above findings, the present inventors have conceived of the invention implemented by the embodiments.

First Embodiment

FIG. 1 is a sectional view illustrating a configuration of a vehicle lamp 10 according to a first embodiment. The vehicle lamp 10 is disposed at each of the right and left sides of the front portion of a vehicle body and functions as a headlamp. The vehicle lamp 10 includes a lamp body 12, a light-transmissive cover 14, a lamp unit 18, and a bracket 20.

In the following descriptions, the front-rear direction of the lamp is regarded as the X-direction, the right-left direction of the lamp (i.e., the widthwise direction of the vehicle) is regarded as the Y-direction, and the up-down direction of the lamp is regarded as the Z-direction.

The lamp body 12 is formed into a box shape having an opening. The light-transmissive cover 14 is attached to this opening. The lamp unit 18 is disposed inside a lamp room 16 defined by the lamp body 12 and the light-transmissive cover 14. The lamp unit 18 is a projector-type optical unit, for example, and includes a light source module 22, a projection lens 24, a lens holder 26, a heat-dissipating fin 38, and a fan 40.

The light source module 22 is fixed to the bracket 20 such that the irradiation axis of the light source module 22 is substantially parallel to the irradiation direction (the left direction in FIG. 1) of the lamp unit 18. The lens holder 26 is fixed at its rear side to the bracket 20.

The projection lens 24 is fixed to a front side of the lens holder 26. The projection lens 24 is a plano-convex aspherical lens having a convex front surface and a planar rear surface. The light source module 22 is disposed in the vicinity of the posterior focal point of the projection lens 24. Light emitted from the light source module 22 is directly incident on the projection lens 24. The light incident on the projection lens 24 is condensed by the projection lens 24 and travels forward as substantially parallel light.

The bracket 20 is tiltably supported by the lamp body 12 with aiming screws 30. Rotating the aiming screws 30 causes the bracket 20 to tilt, which in turn causes the lamp unit 18 to tilt. Thus, the optical axis of the lamp unit 18 can be adjusted in the horizontal direction and in the vertical direction.

The heat-dissipating fin 38 is provided on a rearward surface of the bracket 20. The heat-dissipating fin 38 primarily dissipates heat produced by the light source module 22. The fan 40 is provided between the heat-dissipating fin 38 and the lamp body 12. The fan 40 blows the air toward the heat-dissipating fin 38 to cool the heat-dissipating fin 38.

Figure 2:
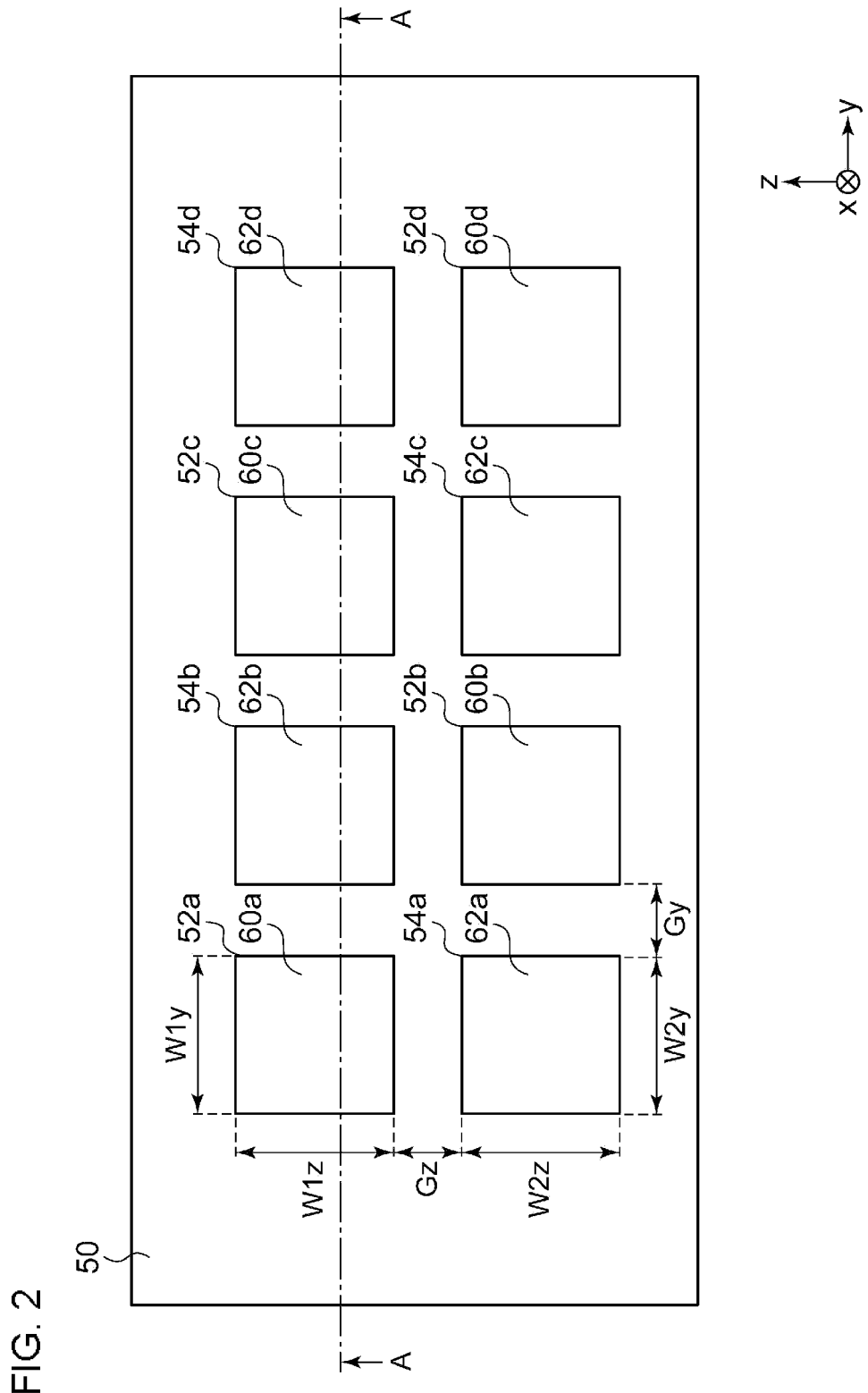
FIG. 2 illustrates a light source module as viewed from the front of the lamp.
Figure 3:
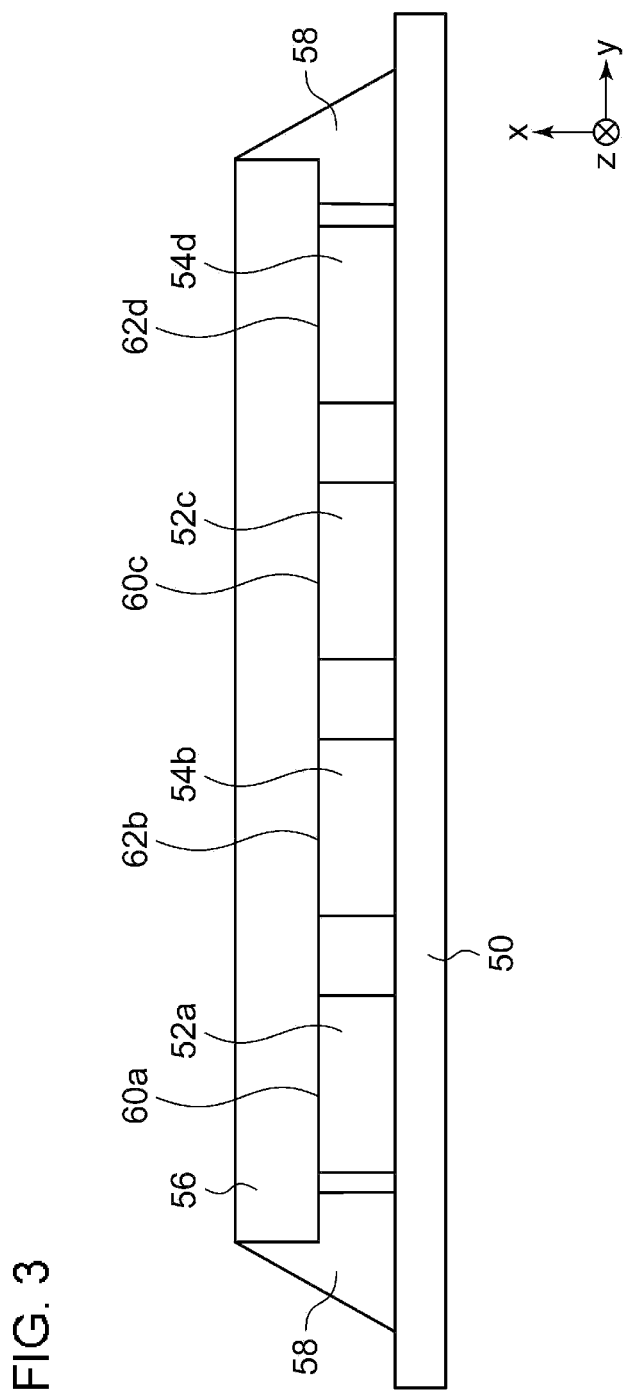
FIG. 3 is a sectional view taken along the A-A line indicated in FIG. 2.

FIG. 2 illustrates the light source module 22 illustrated in FIG. 1 as viewed from the front of the lamp (i.e., in the X-direction). In FIG. 2, a wavelength conversion member 56 and a reflection member 58 are not depicted. FIG. 3 is a sectional view taken along the A-A line indicated in FIG. 2. The light source module 22 includes a substrate 50, four first LED elements (light-emitting elements) 52a to 52d, four second LED elements 54a to 54d, a wavelength conversion member 56, and a reflection member 58. Hereinafter, when the first LED elements 52a to 52d are collectively referred to or are not particularly distinguished therebetween, they are simply referred to as "first LED element(s) 52." In a similar manner, when the second LED elements 54a to 54d are collectively referred to or are not particularly distinguished therebetween, they are simply referred to as "second LED element(s) 54."

The substrate 50 is formed into a plate shape by a material having a high thermal conductivity. The four first LED elements 52a to 52d and the four second LED elements 54a to 54d are disposed on the substrate 50. In other words, they are disposed on the same substrate 50.

The first LED element 52a, the second LED element 54b, the first LED element 52c, and the second LED element 54d are disposed in this order to be arrayed in the Y-direction on the substrate 50. In parallel to the above, the second LED element 54a, the first LED element 52b, the second LED element 54c, and the first LED element 52d are disposed in this order to be arrayed in the Y-direction on the substrate 50. Thus, the first LED elements 52 are adjacent to the second LED elements 54 in the Y-direction and in the Z-direction. Then, naturally, the second LED elements 54 are adjacent to the first LED elements 52 in the Y-direction and in the Z-direction.

The first LED elements 52 are LED elements that emit blue light having a dominant wavelength in a wavelength range of from 420 nm to 485 nm. The second LED elements 54 are LED elements that emit amber light having a dominant wavelength in a wavelength range of from 577 nm to 587 nm.

The wavelength conversion member 56 is disposed in optical paths of the four first LED elements 52a to 52d and the four second LED element 54a to 54d. In the present embodiment, the wavelength conversion member 56 is disposed to oppose emission surfaces 60a to 60d of the four first LED elements 52a to 52d and emission surfaces 62a to 62d of the four second LED elements 54a to 54d.

The wavelength conversion member 56 converts a portion of the blue light emitted by the first LED elements 52 to yellow light having a dominant wavelength in a wavelength range of from 550 nm to 570 nm and transmits at least a portion of the remaining blue light emitted by the first LED elements 52. In addition, the wavelength conversion member 56 substantially transmits the amber light emitted by the second LED elements 54. For example, the wavelength conversion member 56 may transmit no less than 50% of the amber light emitted by the second LED elements 54.

Specifically, the wavelength conversion member 56 includes a phosphor. This phosphor absorbs a portion of the blue light emitted by the first LED elements 52 to emit yellow light in a Lambertian manner. At least a portion of the remaining blue light emitted by the first LED elements 52 exits from the wavelength conversion member 56 without being absorbed by the phosphor. The amber light emitted by the second LED elements 54 exits from the wavelength conversion member 56 substantially without being absorbed by the phosphor (e.g., no less than 70% of the amber light remains unabsorbed by the phosphor). The amber light emitted by the second LED elements 54 is in particular diffused by the phosphor and exits from the wavelength conversion member 56.

The blue light transmitted through the wavelength conversion member 56 and the yellow light converted by the wavelength conversion member 56 are mixed, and white light is generated. In the present embodiment, the amber light transmitted through the wavelength conversion member 56 is further mixed into this white light. As will be described later, by varying the luminance of the amber light to be mixed into the white light, the color temperature of the white light can be varied.

Figure 4:
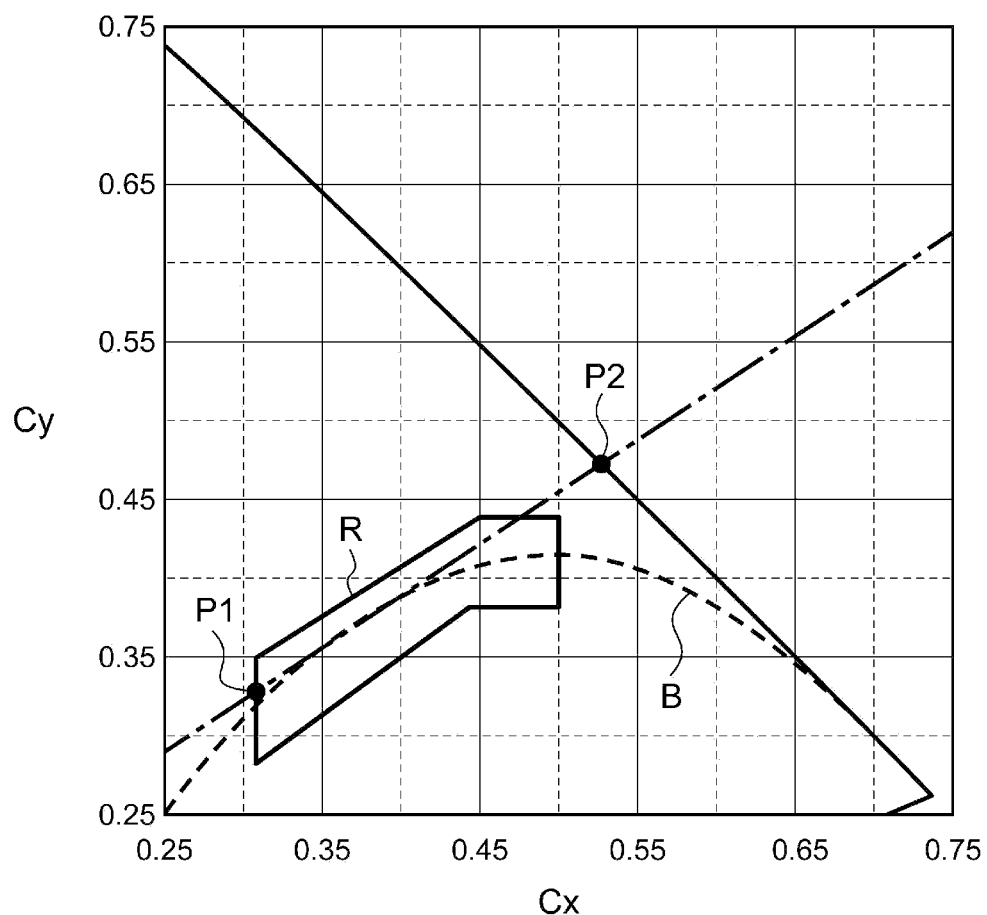
FIG. 4 illustrates an XY chromaticity diagram.

FIG. 4 illustrates an XY chromaticity diagram. In FIG. 4, a rectangular region R indicates a white color standard range for a vehicle lamp. In addition, a graph B indicates a blackbody radiation locus. A chromaticity point P1 indicates a chromaticity point of the white light that is based on the first LED elements 52 and the wavelength conversion member 56, and a chromaticity point P2 indicates a chromaticity point of the amber light from the second LED elements 54. The correlated color temperature at the chromaticity point P1 is from 6000 K to 7200 K, and the dominant wavelength at the chromaticity point P2 is from 577 nm to 587 nm. Varying the mixing ratio of the white light and the amber light makes it possible to adjust the correlated color temperature as desired on a straight line connecting the chromaticity point P1 and the chromaticity point P2. As can be seen clearly from FIG. 4, the color temperature can be varied within the white color standard range. In particular, the color temperature of the white light can be adjusted along the blackbody radiation locus.

Referring back to FIGS. 2 and 3, the reflection member 58 reflects light from the LED elements. Thus, light that has reached the reflection member 58 without directly traveling to the wavelength conversion member 56 is reflected by the reflection member 58 and is also used as the irradiation light. Therefore, the utilization efficiency of the light source in the light source module 22 and in turn in the vehicle lamp 10 improves, and brighter light can be obtained or light of the same brightness can be obtained with less power consumption.

Intervals between the first LED elements 52 and the second LED elements 54 are designed as appropriate through an experiment or accumulated knowledge in consideration of suppressing the luminance unevenness and the color unevenness of the light emerging from the wavelength conversion member 56 and in turn the light emitted from the light source module 22.

Preferably, an interval between the first LED elements 52 and the second LED elements 54 is set no greater than a smaller one of the width of a first LED element 52 in an array direction in which the first LED elements 52 and the second LED elements 54 are arrayed and the width of a second LED element 54 in the array direction. More preferably, the stated interval is set no greater than one-half a smaller one of the width of a first LED element 52 in the array direction in which the first LED elements 52 and the second LED elements 54 are arrayed and the width of a second LED element 54 in the array direction.

In the present embodiment, the first LED elements 52 and the second LED elements 54 are arrayed in the Y-direction and in the Z-direction. Preferably, an interval Gy between the first LED elements 52 and the second LED elements 54 in the Y-direction satisfies "Gy≤min (W1$y$, W2$y$)." Herein, W1$y$ is the width of each first LED element 52 in the Y-direction, and W2$y$ is the width of each second LED element 54 in the Y-direction. More preferably, the interval Gy satisfies "Gy≤min (½×W1$y$, ½×W2$y$)."

Preferably, an interval Gz between the first LED elements 52 and the second LED elements 54 satisfies "Gz≤min (W1$z$, W2$z$)." Herein, W1$z$ is the width of each first LED element 52 in the Z-direction, and W2$z$ is the width of each second LED element 54 in the Z-direction. More preferably, the interval Gz satisfies "Gz≤min(½×W1$z$, ½×W2$z$)." FIG. 2 illustrates a case in which Gy=Gz and W1$y$=W2$y$=W1$z$=W2$z$ hold.

Figure 5:
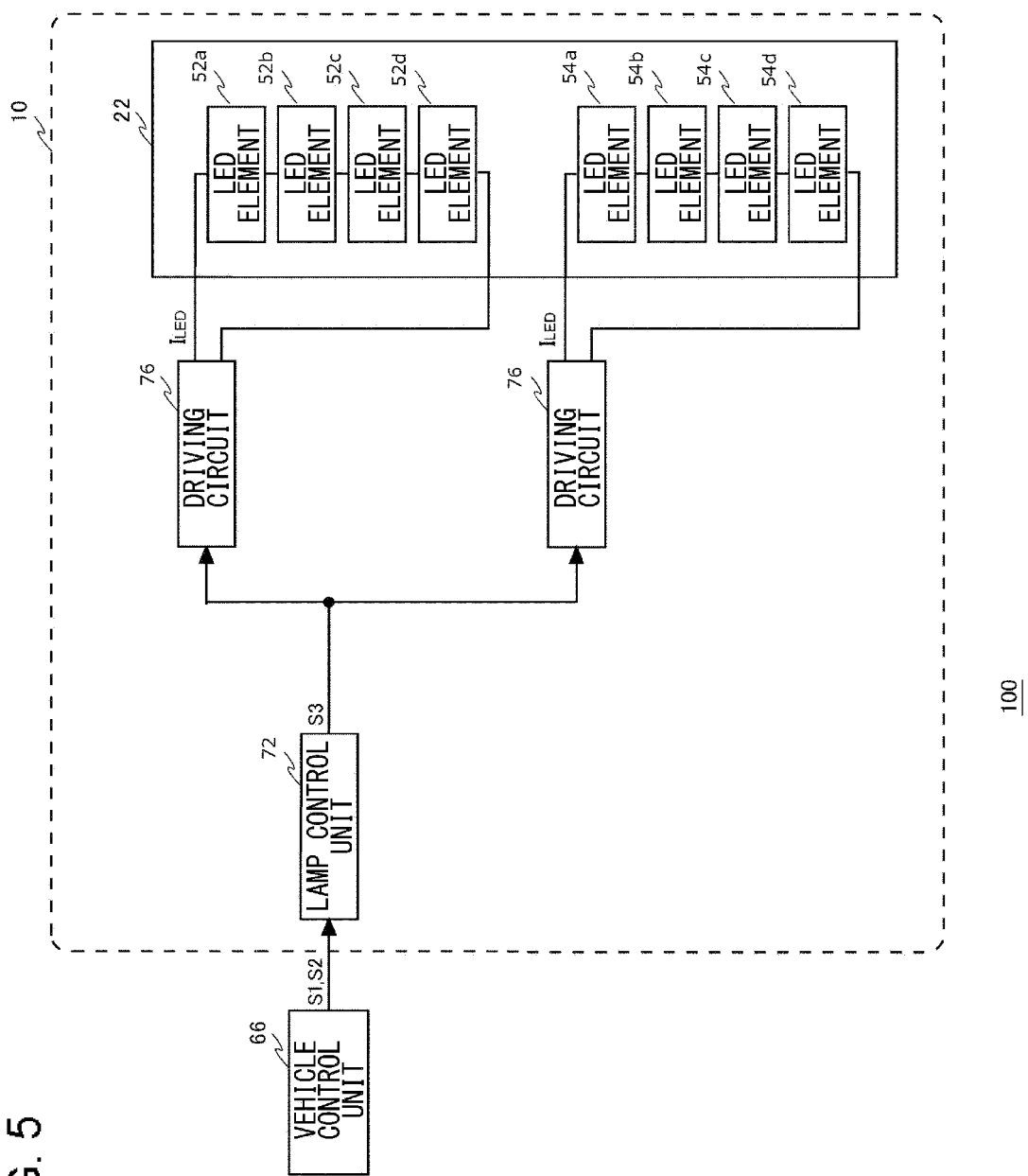
FIG. 5 is a block diagram illustrating a vehicle lamp system provided with the vehicle lamp illustrated in FIG. 1.

FIG. 5 is a block diagram illustrating a vehicle lamp system 100 provided with the vehicle lamp 10 illustrated in FIG. 1. The vehicle lamp system 100 includes the vehicle lamp 10 and a vehicle control unit 66.

The vehicle control unit 66 controls the vehicle lamp 10 as a whole. The vehicle control unit 66 transmits, to the vehicle lamp 10, an on/off instruction S1 to turn on or off the lamp, information (traveling information) S2 indicating traveling conditions, and so on. The on/off instruction S1 includes an instruction, from a user, to turn on or off the light source module 22 as well as an adjustment instruction of the correlated color temperature of the white light emitted from the light source module 22. The traveling information S2 includes a driving time (the time elapsed since the driving has started), a vehicle speed, and a raining condition.

The vehicle lamp 10 further includes a lamp control unit 72 and two driving circuits 76.

The lamp control unit 72 individually controls the first LED elements 52 and the second LED elements 54 in accordance with the on/off instruction S1 and the traveling information S2 from the vehicle control unit 66. Specifically, the lamp control unit 72 generates a light control signal S3 in accordance with the on/off instruction S1 and the traveling information S2. The driving circuits 76 supply driving currents $I_{LED}$ corresponding to the light control signal S3 to the LED elements.

The lamp control unit 72 controls the first LED elements 52 and the second LED elements 54 such that the correlated color temperature of the white light emitted from the light source module 22 and in turn from the vehicle lamp 10 becomes relatively high (e.g., 6000 K to 7200 K), when the driving time indicated by the traveling information S2 is shorter than a predetermined time (e.g., 30 minutes) or when the vehicle speed indicated by the traveling information S2 is no lower than a predetermined value (e.g., 80 km/h) (i.e., when it is determined that the vehicle is traveling on an expressway). Specifically, the lamp control unit 72 raises the luminance of the first LED elements 52 that emit the blue light and/or lowers the luminance of the second LED elements that emit the amber light. Thus, the lamp control unit 72 relatively raises the correlated color temperature of the white light emitted from the light source module 22 and in turn from the vehicle lamp 10. The lamp control unit 72 may control the luminance of the first LED elements 52 and the second LED elements 54 such that the correlated color temperature increases in accordance with an increase in the vehicle speed.

When the traveling information S2 indicates that it is raining, the lamp control unit 72 controls the first LED elements 52 and the second LED elements 54 such that the correlated color temperature of the white light emitted from the light source module 22 and in turn from the vehicle lamp 10 becomes relatively low (e.g., 2800 K to 4000 K). Specifically, the lamp control unit 72 lowers the luminance of the first LED elements 52 that emit the blue light and/or raises the luminance of the second LED elements that emit the amber light. Thus, the lamp control unit 72 relatively lowers the correlated color temperature of the white light emitted from the light source module 22 and in turn from the vehicle lamp 10. The lamp control unit 72 may control the luminance of the first LED elements 52 and the second LED elements 54 such that the correlated color temperature decreases in accordance with an increase in the amount of rainfall.

The lamp control unit 72 controls the first LED elements 52 and the second LED elements 54 such that the correlated color temperature of the white light emitted from the light source module 22 and in turn from the vehicle lamp 10 becomes a mid temperature (e.g., 4000 K to 6000 K), when the vehicle speed indicated by the traveling information S2 is lower than a predetermined value (e.g., 80 km/h) (i.e., when it is determined that the vehicle is traveling in a city area).

The lamp control unit 72 controls the first LED elements 52 and the second LED elements 54 in accordance with the adjustment instruction of the correlated color temperature included in the on/off instruction S1. For example, when being instructed to raise the correlated color temperature, the lamp control unit 72 raises the luminance of the first LED elements 52 that emit the blue light and/or lowers the luminance of the second LED elements that emit the amber light. In addition, for example, when being instructed to lower the correlated color temperature, the lamp control unit 72 lowers the luminance of the first LED elements 52 that emit the blue light and/or raises the luminance of the second LED elements that emit the amber light.

With the light source module 22 according to the present embodiment described thus far, the first LED elements 52 and the second LED elements 54 are individually controlled, and the proportion of the amber light from the second LED elements 54 in the white light is varied. Thus, the color temperature of the white light can be adjusted within the white color standard.

In addition, with the light source module 22 according to the present embodiment, preferably, the interval between the first LED elements 52 and the second LED elements 54 is set no greater than one-half a smaller one of the width of a first LED element 52 and the width of a second LED element 54. In this case, the luminance unevenness and the color unevenness of the light emitted from the light source module 22 can be suppressed.

With the vehicle lamp 10 according to the present embodiment, the correlated color temperature is adjusted automatically to a correlated color temperature suitable for the traveling conditions. This provides improved visibility and improved safety.

Second Embodiment

Figure 6:
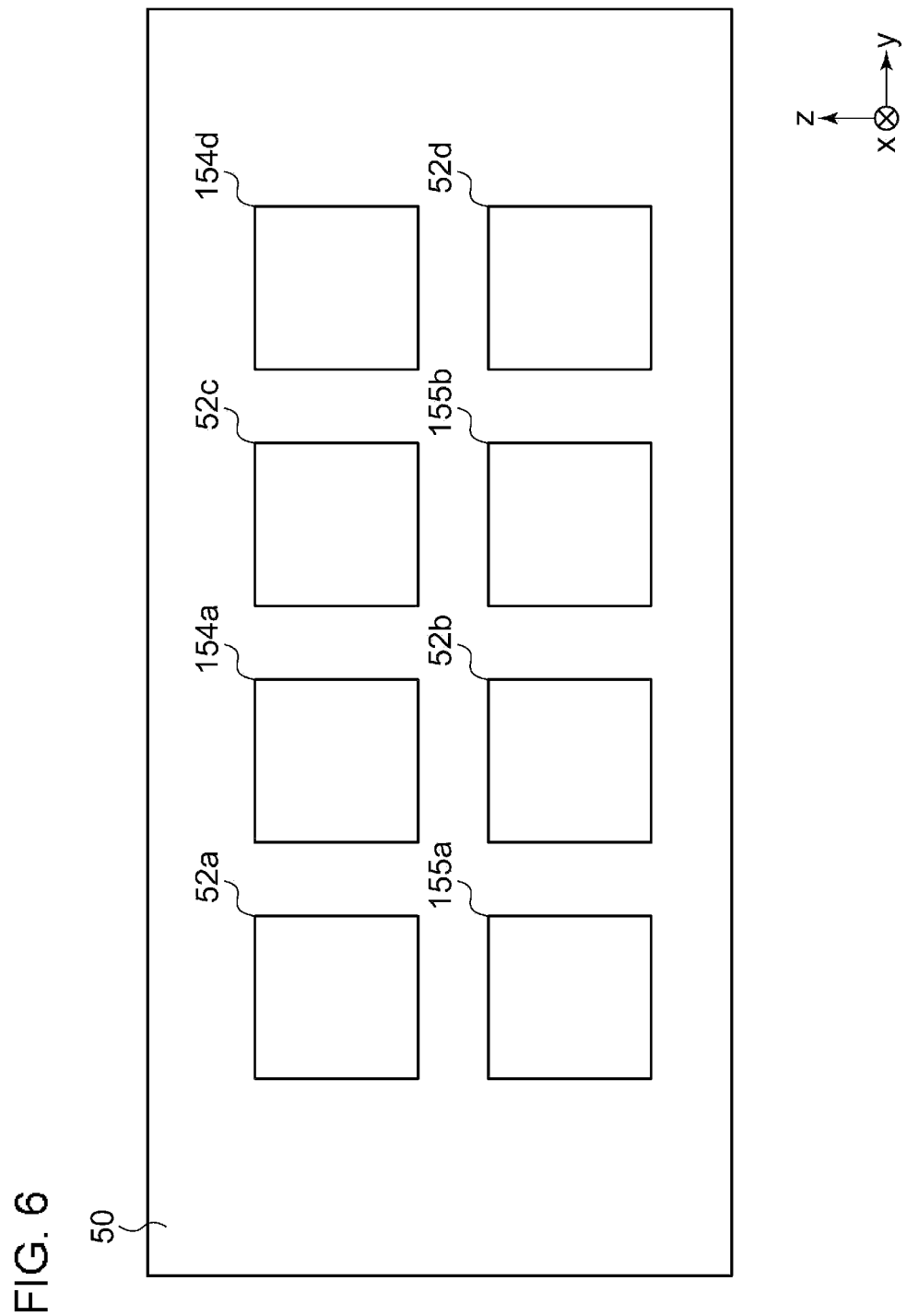
FIG. 6 illustrates a light source module according to a second embodiment.

FIG. 6 illustrates a light source module 122 according to a second embodiment. FIG. 6 corresponds to FIG. 2. The light source module 122 includes a substrate 50, four first LED elements 52a to 52d, two second LEDs 154a and 154b, two third LEDs 155a and 155b, a wavelength conversion member (not illustrated), and a reflection member (not illustrated).

The second LEDs 154a and 154b are LED elements that emit amber-to-red light having a dominant wavelength in a wavelength range of from 582 nm to 700 nm. The third LED elements 155a and 155b are LED elements that emit green-to-amber light having a dominant wavelength in a wavelength range of from 551 nm to 582 nm.

Similarly to the first embodiment, the wavelength conversion member converts a portion of blue light emitted by the first LED elements 52 to yellow light having a dominant wavelength in a range of from 550 nm to 570 nm and transmits at least a portion of the remaining blue light emitted by the first LED elements 52. In addition, the wavelength conversion member substantially transmits the amber-to-red light emitted by the second LED elements 154. For example, the wavelength conversion member may transmit no less than 50% of the amber-to-red light emitted by the second LED elements 154. Furthermore, the wavelength conversion member substantially transmits the green-to-amber light emitted by the third LED elements 155. For example, the wavelength conversion member may transmit no less than 50% of the green-to-amber light emitted by the third LED elements 155.

Specifically, a phosphor in the wavelength conversion member absorbs a portion of the blue light emitted by the first LED elements 52 to emit yellow light in a Lambertian manner. At least a portion of the remaining blue light emitted by the first LED elements 52 exits from the wavelength conversion member without being absorbed by the phosphor. The amber-to-red light emitted by the second LED elements 154 exits from the wavelength conversion member substantially without being absorbed by the phosphor (e.g., no less than 70% of the amber-to-red light remains unabsorbed by the phosphor). The amber-to-red light emitted by the second LED elements 154 is in particular diffused by the phosphor and exits from the wavelength conversion member.

The green-to-amber light emitted by the third LED elements 155 exits from the wavelength conversion member substantially without being absorbed by the phosphor (e.g., no less than 70% of the green-to-amber light remains unabsorbed by the phosphor). The green-to-amber light emitted by the third LED elements 155 is in particular diffused by the phosphor and exits from the wavelength conversion member.

The blue light transmitted through the wavelength conversion member and the yellow light converted by the wavelength conversion member are mixed, and white light is generated. In the present embodiment, the amber-to-red light and the green-to-amber light transmitted through the wavelength conversion member are further mixed into this white light. Thus, by varying the proportion (s) of the amber-to-red light and/or the green-to-amber light to be mixed in the white color, the color temperature of the white light can be varied within the white color standard.

Figure 7:
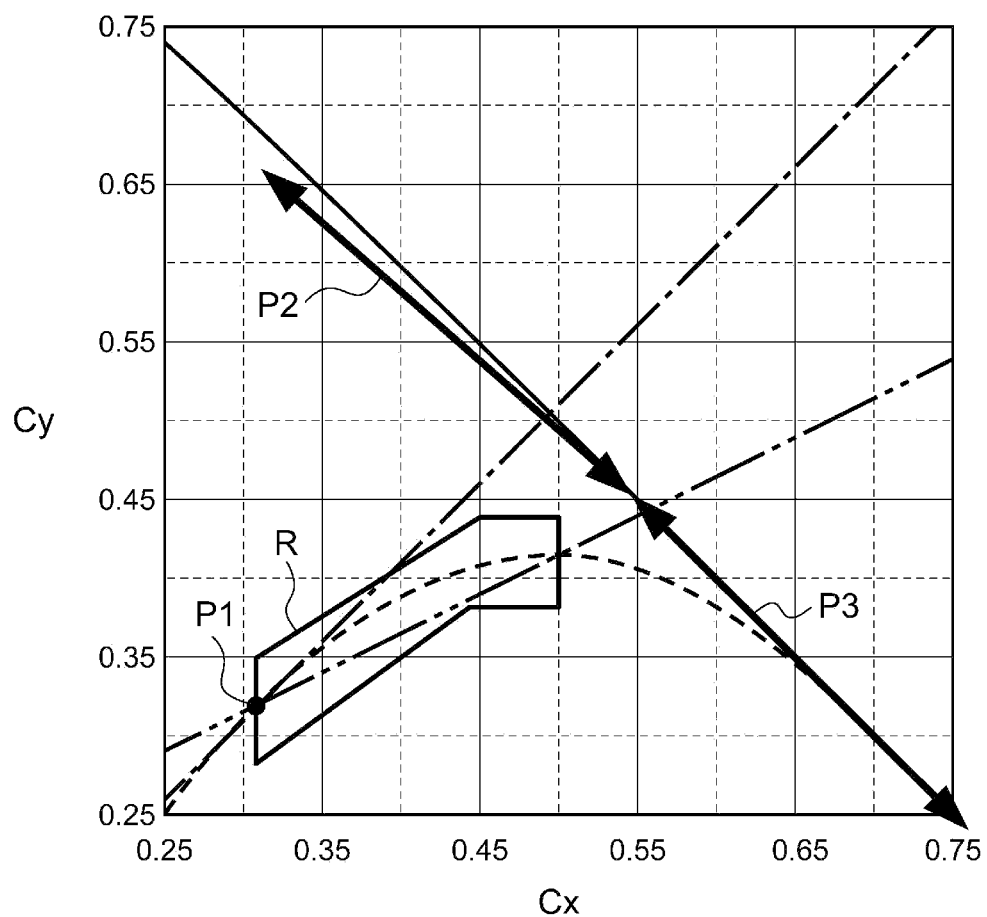
FIG. 7 illustrates an XY chromaticity diagram.

FIG. 7 illustrates an XY chromaticity diagram. A chromaticity point P1 indicates a chromaticity point of the white light that is based on the first LED elements 52 and the wavelength conversion member 56, a chromaticity point P2 indicates a chromaticity point of the amber-to-red light from the second LED elements 154, and a chromaticity point P3 indicates a chromaticity point of the green-to-amber light from the third LED elements 155. The correlated color temperature at the chromaticity point P1 is from 6000 K to 7200 K, the dominant wavelength at the chromaticity point P2 is from 551 nm to 582 nm, and the dominant wavelength at the chromaticity point P3 is from 582 nm to 700 nm. Varying the color mixing ratio of the white light, the amber-to-red light, and the green-to-amber light makes it possible to adjust the correlated color temperature as desired within a triangular range enclosed by the three chromaticity points P1, P2, and P3. Therefore, as can be seen clearly from FIG. 7, light in any shade of white color on blackbody radiation can be emitted within the white color standard range.

With the light source module 122 according to the present embodiment described thus far, an advantageous effect similar to the advantageous effect provided by the light source module 22 according to the first embodiment can be provided. In addition, with the light source module 122 according to the present embodiment, the irradiation light is generated by mixing the three colors of light, and thus the light can be varied to any shade of white color on blackbody radiation within the white color standard.

Third Embodiment

Figure 8:
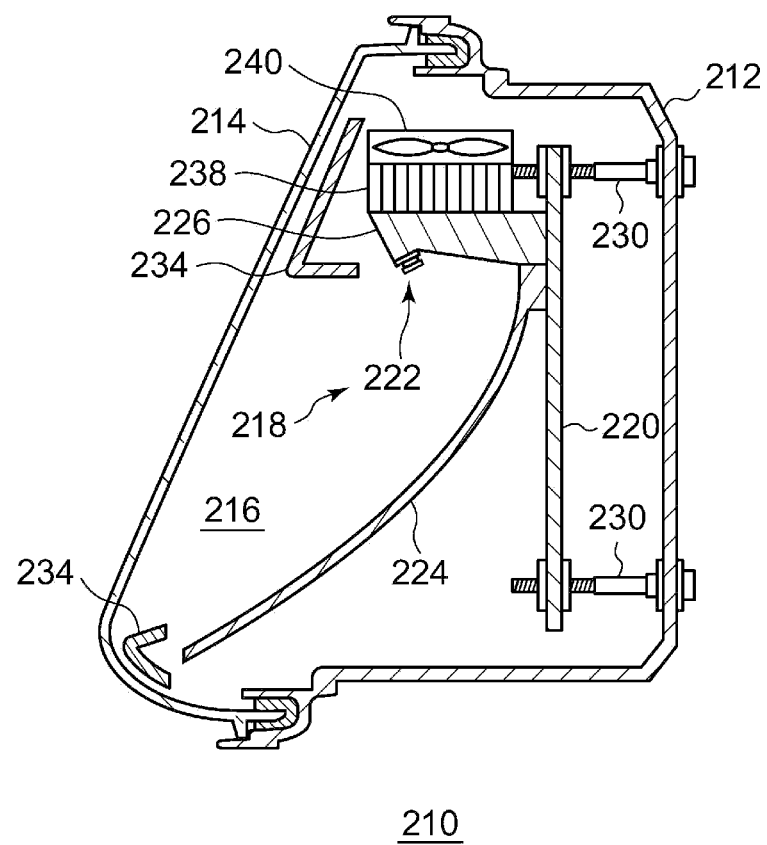
FIG. 8 is a schematic diagram illustrating a configuration of a vehicle lamp according to a third embodiment.

FIG. 8 is a sectional view illustrating a configuration of a vehicle lamp 210 according to a third embodiment. The vehicle lamp 210 is disposed at each of the right and left sides of the front portion of a vehicle body and functions as a headlamp. The vehicle lamp 210 includes a lamp body 212, a light-transmissive cover 214, a lamp unit 218, a bracket 220, and an extension 234.

The lamp body 212 is formed into a box shape having an opening. The light-transmissive cover 214 is attached to this opening. The lamp body 212 and the light-transmissive cover 214 form a lamp room 216, and the lamp unit 218, the bracket 220, and the extension 234 are disposed inside the lamp room 216.

The bracket 220 supports the lamp unit 218. The bracket 220 is tiltably supported by the lamp body 212 with aiming screws 230. Rotating the aiming screws 230 causes the bracket 220 to tilt, which in turn causes the lamp unit 218 to tilt. Thus, the optical axis of the lamp unit 218 can be adjusted in the horizontal direction and in the vertical direction.

The extension 234 is disposed to cover a region between the opening in the lamp body 212 and the lamp unit 218. Thus, the inner structure of the vehicle lamp 210 can be concealed.

The lamp unit 218 is a parabolic optical unit in the present embodiment and includes a light source module 222, a reflector 224, a support member 226, a heat-dissipating fin 238, and a fan 240. The support member 226 is a member that extends in the front-rear direction and is fixed at its rear side to the bracket 220.

The heat-dissipating fin 238 is provided on an upper surface of the support member 226. The heat-dissipating fin 238 primarily dissipates heat produced by the light source module 222. The fan 240 is provided between the heat-dissipating fin 238 and the lamp body 212. The fan 240 blows the air toward the heat-dissipating fin 238 to cool the heat-dissipating fin 238.

The light source module 222 is attached to a lower surface of the support member 226 such that the principal optical axis of the light source module 222 is oriented slightly toward the rearward of the lamp.

Figure 9:
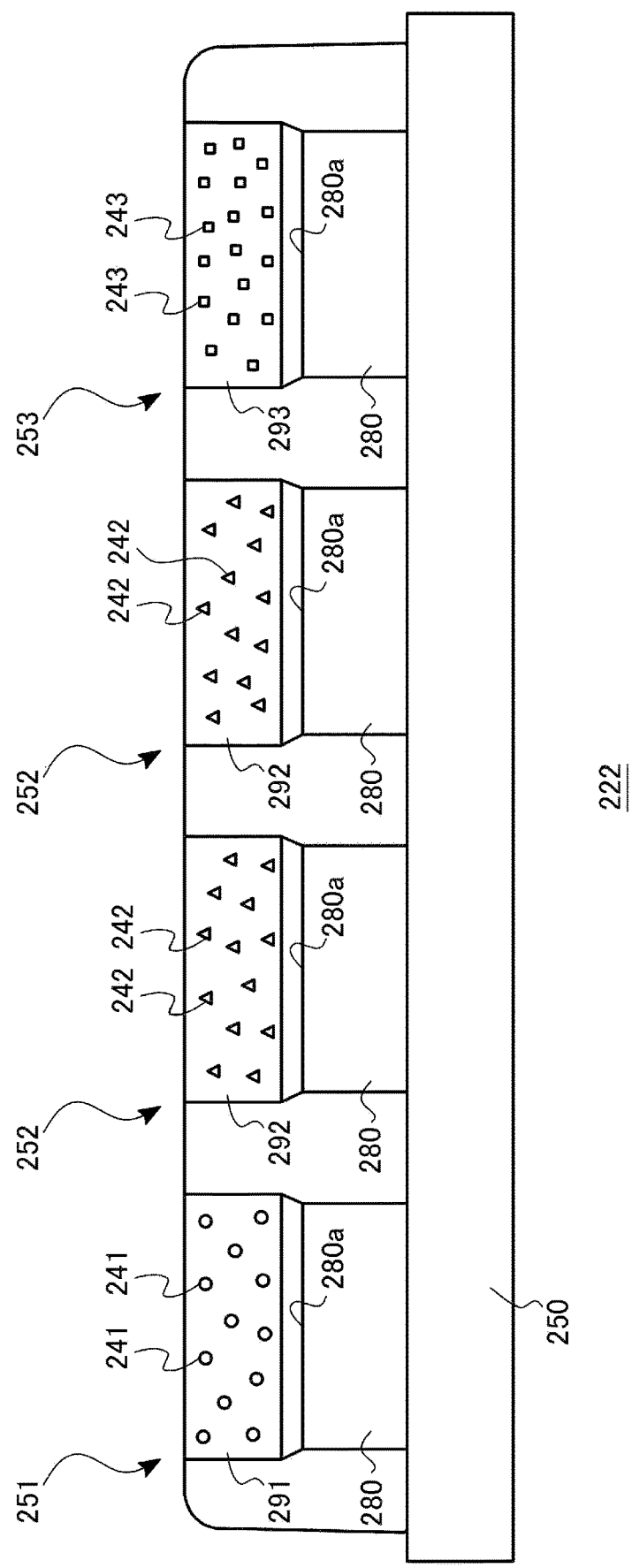
FIG. 9 is a schematic sectional view of the light source module illustrated in FIG. 8.

FIG. 9 is a schematic sectional view of the light source module 222 illustrated in FIG. 8. The light source module 222 includes a substrate 250, a single first light source 251, two second light sources 252, and a single third light source 253. The substrate 250 is formed into a plate shape by a material having a high thermal conductivity.

The first light source 251, the second light source 252, and the third light source 253 each emit light at a different correlated color temperature. In the present embodiment, the first light source 251 emits light at a correlated color temperature Tc1 (in particular, Tc1>6,500 K), the second light sources 252 each emit light at a correlated color temperature Tc2 (in particular, 3,000≤K Tc2≤6,500 K), and the third light source 253 emits light at a correlated color temperature Tc3 (in particular, Tc3<3,000 K). These types of light generate white light. In particular, in the present embodiment, by varying the output of the light emitted by each of the first light source 251, the second light sources 252, and the third light source 253, the correlated color temperature of the white light can be adjusted.

Specifically, the first light source 251 includes an LED element (light-emitting element) 280 and a first wavelength conversion member 291. The second light sources 252 each include an LED element 280 and a second wavelength conversion member 292. The third light source 253 includes an LED element 280 and a third wavelength conversion member 293. In other words, the light sources include the LED elements that emit light having a dominant wavelength in a substantially identical wavelength range.

Each of the first wavelength conversion member 291, the second wavelength conversion members 292, and the third wavelength conversion member 293 is disposed in an optical path of the corresponding one of the LED elements 280. In the present embodiment, each of the first wavelength conversion member 291, the second wavelength conversion members 292, and the third wavelength conversion member 293 is disposed to oppose an emission surface 280a of the corresponding one of the LED elements 280.

The first wavelength conversion member 291, the second wavelength conversion members 292, and the third wavelength conversion member 293 include first phosphors 241, second phosphors 242, and third phosphors 243, respectively. Each of the phosphors absorbs a portion of the light emitted by the corresponding one of the LED elements 280 to emit light at a wavelength different from that of the light emitted by the LED elements 280.

In the present embodiment, there is a difference in at least one of the following (1) to (3) concerning the configuration of the light sources. Thus, each of the light sources can emit light at a different correlated color temperature from the light emitted by the LED elements 280 having a dominant wavelength in a substantially identical wavelength range.

(1) The composition of the first phosphors 241, the composition of the second phosphors 242, and the composition of the third phosphors 243

(2) The concentration of the first phosphors 241 contained in the first wavelength conversion member 291, the concentration of the second phosphors 242 contained in the second wavelength conversion member 292, and the concentration of the third phosphors 243 contained in the third wavelength conversion member 293; or the activator concentration of the first phosphors 241 contained in the first wavelength conversion member 291, the activator concentration of the second phosphors 242 contained in the second wavelength conversion member 292, and the activator concentration of the third phosphors 243 contained in the third wavelength conversion member 293

(3) The thickness of the first wavelength conversion member 291, the thickness of the second wavelength conversion member 292, and the thickness of the third wavelength conversion member 293

In one example, the LED elements 280 each emit light having a dominant wavelength in a wavelength range of from 420 nm to 490 nm. The first wavelength conversion member 291 converts a portion of the light from the LED element 280 to light having a dominant wavelength in a wavelength range of from 560 nm to 568 nm and transmits at least a portion of the remaining light emitted by the LED element 280. Thus, the first light source 251 emits light at the correlated color temperature Tc1 in which the light transmitted through the first wavelength conversion member 291 and the light having its wavelength converted by the first wavelength conversion member 291 are mixed.

The second wavelength conversion member 292 converts a portion of the light from the LED element 280 to light having a dominant wavelength in a wavelength range of from 568 nm to 576 nm and transmits at least a portion of the remaining light emitted by the LED element 280. Thus, the second light source 252 emits light at the correlated color temperature Tc2 in which the light transmitted through the second wavelength conversion member 292 and the light having its wavelength converted by the second wavelength conversion member 292 are mixed.

The third wavelength conversion member 293 converts a portion of the light from the LED element 280 to light having a dominant wavelength in a wavelength range of from 576 nm to 584 nm and transmits at least a portion of the remaining light emitted by the LED element 280. Thus, the third light source 253 emits light at the correlated color temperature Tc3 in which the light transmitted through the third wavelength conversion member 293 and the light having its wavelength converted by the third wavelength conversion member 293 are mixed.

Referring back to FIG. 8, the reflector 224 is attached to a front surface of the bracket 220 such that the reflector 224 is located underneath the support member 226. The reflector 224 functions as an optical member that condenses the light emitted by the light source module 222 toward the front of the lamp. Specifically, the reflector 224 directs, toward the front of the lamp, a combined light-distribution pattern in which the light emitted by the first light source 251, the light emitted by the two second light sources 252, and the light emitted by the third light source 253 are partially or entirely superposed on one another. In other words, the reflector 224 is formed into such a shape that can partially or entirely superpose the light emitted by each light source.

Therefore, by varying the output of the light at the correlated color temperature Tc1 emitted from the first light source 251, the output of the light at the correlated color temperature Tc2 emitted from the two second light sources 252, and the output of the light at the correlated color temperature Tc3 emitted from the third light source 253, the correlated color temperature of their combined light-distribution pattern can be partially or entirely varied. In other words, the color of the light-distribution pattern can be varied partially or entirely within a range of a similar color (within a range of white color in the present embodiment). In particular, the color may be varied within the white color standard range.

Figure 10:
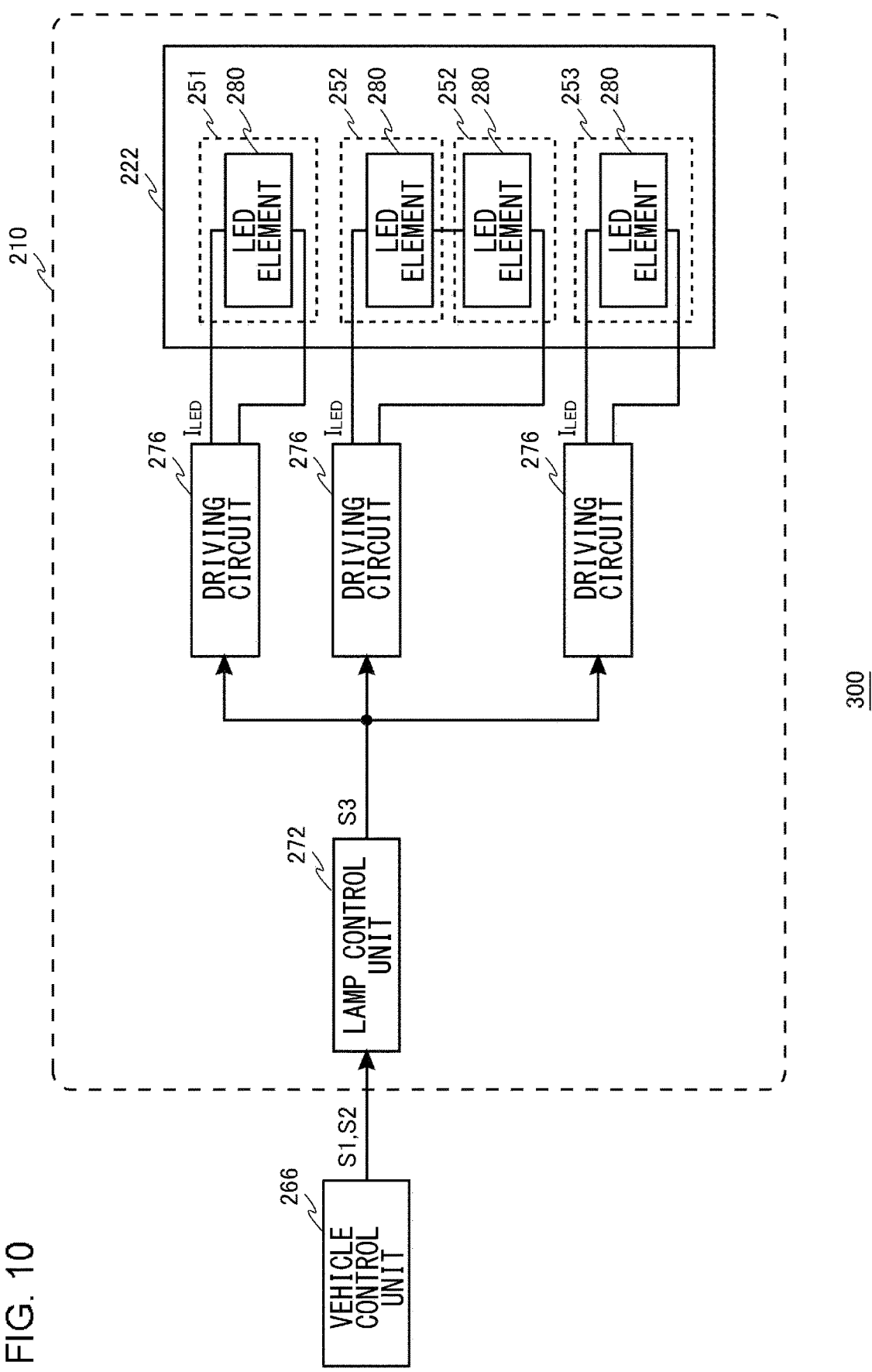
FIG. 10 is a block diagram illustrating a vehicle lamp system provided with the vehicle lamp illustrated in FIG. 8.

FIG. 10 is a block diagram illustrating a vehicle lamp system 300 provided with the vehicle lamp 210 illustrated in FIG. 8. The vehicle lamp system 300 includes the vehicle lamp 210 and a vehicle control unit 266.

The vehicle control unit 266 controls the vehicle lamp 210 as a whole. The vehicle control unit 266 transmits, to the vehicle lamp 210, an on/off instruction S1 to turn on or off the lamp, information (traveling information) S2 indicating traveling conditions, and so on. The on/off instruction S1 includes an instruction, from a user, to turn on or off the light source module 222 as well as an adjustment instruction, from the user, of the correlated color temperature of the white light emitted from the light source module 222. The traveling information S2 includes a driving time (time elapsed since the driving has started), a vehicle speed, and a raining condition.

The vehicle lamp 210 further includes a lamp control unit 272 and three driving circuits 276.

The lamp control unit 272 individually controls the first light source 251, the two second light sources 252, and the third light source 253 in accordance with the on/off instruction S1 and the traveling information S2 from the vehicle control unit 266. Specifically, the lamp control unit 272 generates a light control signal S3 in accordance with the on/off instruction S1 and the traveling information S2. The driving circuits 276 supply driving currents $I_{LED}$ corresponding to the light control signal S3 to the LED elements 280.

The lamp control unit 272 controls each of the light sources such that the correlated color temperature of the white light emitted from the light source module 222 and in turn from the vehicle lamp 210 becomes relatively high (e.g., 5500 K to 7200 K), when the driving time indicated by the traveling information S2 is shorter than a predetermined time (e.g., 30 minutes) or when the vehicle speed indicated by the traveling information S2 is no lower than a predetermined value (e.g., 80 km/h) (i.e., when it is determined that the vehicle is traveling on an expressway). For example, the lamp control unit 272 raises the output of the first light source 251 (i.e., raises the output of the LED element 280 in the first light source 251) and/or lowers the output of the third light source 253 (i.e., lowers the output of the LED element 280 in the third light source 253). Thus, the lamp control unit 272 relatively raises the correlated color temperature of the white light emitted from the light source module 222 and in turn from the vehicle lamp 210. The lamp control unit 272 may control the outputs of the first light source 251, the second light sources 252, and the third light source 253 such that the correlated color temperature of the white light from the light source module 222 relatively increases in accordance with an increase in the vehicle speed.

When the traveling information S2 indicates that it is raining, the lamp control unit 272 controls each of the light sources such that the correlated color temperature of the white light emitted from the light source module 222 and in turn from the vehicle lamp 210 becomes relatively low (e.g., 2500 K to 3200 K). For example, the lamp control unit 272 raises the output of the third light source 253 and/or lowers the output of the first light source 251. Thus, the lamp control unit 272 relatively lowers the correlated color temperature of the white light emitted from the light source module 222 and in turn from the vehicle lamp 210. The lamp control unit 272 may control the outputs of the first light source 251, the second light sources 252, and the third light source 253 such that the correlated color temperature of the white light from the light source module 222 decreases in accordance with an increase in the amount of rainfall.

The lamp control unit 272 controls each of the light sources such that the correlated color temperature of the white light emitted from the light source module 222 and in turn from the vehicle lamp 210 becomes a mid temperature (e.g., 3200 K to 5500 K), when the vehicle speed indicated by the traveling information S2 is lower than a predetermined value (e.g., 80 km/h) (i.e., when it is determined that the vehicle is traveling in a city area). For example, the lamp control unit 272 raises the output of the second light sources 252 (i.e., raises the output of the LED elements 280 in the second light sources 252) and/or lowers the outputs of the first light source 251 and the third light source 253. Thus, the lamp control unit 272 controls to bring the correlated color temperature of the white light emitted from the light source module 222 and in turn from the vehicle lamp 210 to a mid temperature.

The lamp control unit 272 controls the first light source 251, the second light sources 252, and the third light source 253 in accordance with the adjustment instruction, from the user, concerning the correlated color temperature included in the on/off instruction S1. For example, when an instruction to raise the correlated color temperature is included, the lamp control unit 272 raises the output of the first light source 251 and/or the lower the output of the third light source 253. In addition, for example, when an instruction to lower the correlated color temperature is included, the lamp control unit 272 raises the output of the third light source 253 and/or lowers the output of the first light source 251. Furthermore, for example, when an instruction to bring the correlated color temperature to amid temperature is included, the lamp control unit 272 raises the output of the second light sources 252 and/or lowers the outputs of the first light source 251 and the third light source 253.

With the light source module 222 according to the present embodiment described thus far, the first light source 251, the second light sources 252, and the third light source 253 are individually controlled, and the output of the light from each light source is varied. Thus, the color temperature of the white light can be adjusted.

In addition, with the vehicle lamp 210 according to the present embodiment, a combined light-distribution pattern in which light from each of the light sources is superposed is formed, and the correlated color temperature of the combined light-distribution pattern can be varied partially or entirely. In other words, the color of the light-distribution pattern can be varied partially or entirely within a range of white color.

With the vehicle lamp 210 according to the present embodiment, the correlated color temperature is adjusted automatically to a correlated color temperature suitable for the traveling conditions. In addition, the correlated color temperature can be adjusted to a correlated color temperature of the user's preference. This provides improved visibility and improved safety.

Fourth Embodiment

Figure 11:
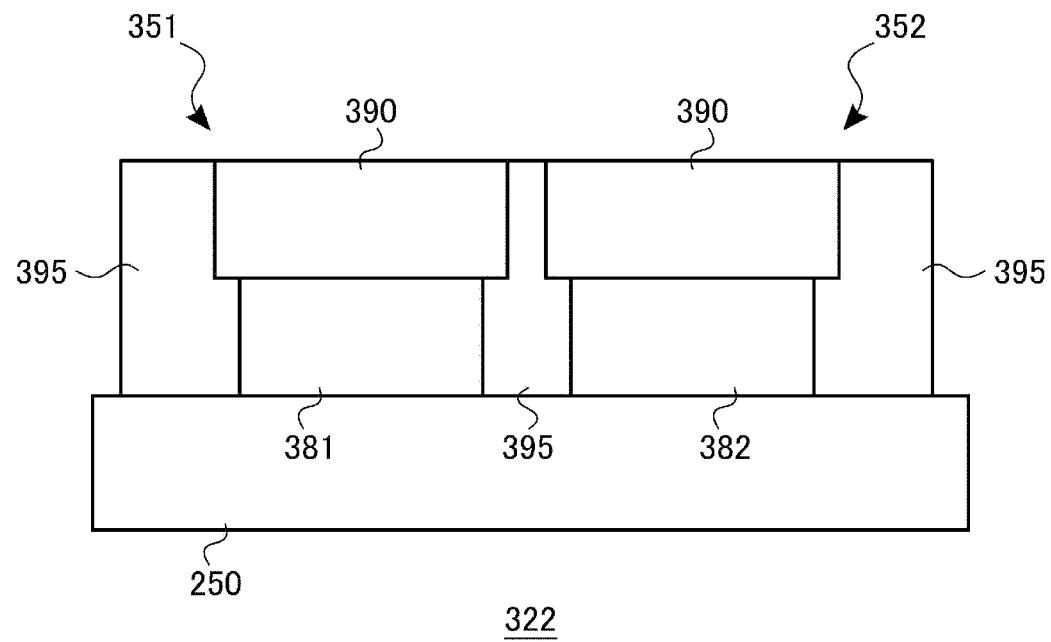
FIG. 11 is a schematic sectional view illustrating a light source module according to a fourth embodiment.

FIG. 11 is a schematic sectional view of a light source module 322 according to a fourth embodiment. FIG. 11 corresponds to FIG. 9. The light source module 322 includes a substrate 250, a first light source 351, a second light source 352, and a reflection member 395. The first light source 351 emits light at a correlated color temperature Tc1, and the second light source 352 emits light at a correlated color temperature Tc2 (>Tc1). In the present embodiment, the difference between the correlated color temperature of the irradiation light from the first light source 351 and the correlated color temperature of the irradiation light from the second light source 352 is no smaller than 500 K (i.e., (Tc2−Tc1)≥500 K).

Specifically, the first light source 351 includes a first LED element 381 and a wavelength conversion member 390. The second light source 352 includes a second LED element 382 and a wavelength conversion member 390. In other words, the light sources each include an LED element that emits light having a different dominant wavelength in the present embodiment. Yet, the light sources include the respective wavelength conversion members having a substantially identical configuration. The wavelength conversion member 390 includes a predetermined phosphor (not illustrated). This phosphor absorbs a portion of the light emitted by the first LED element 381 or the second LED element 382 to emit light at a wavelength different from that of the light emitted by the first LED element 381 or the second LED element 382. In other words, in the present embodiment, the first light source 351 and the second light source 352 each emit light at a different correlated color temperature as the LED elements in the first light source 351 and the second light source 352 each emit light having a different dominant wavelength.

In one example, the first LED element 381 emits light having a dominant wavelength in a wavelength range of from 430 nm to 450 nm. The second LED element 382 emits light having a dominant wavelength in a wavelength range of from 450 nm to 475 nm.

The reflection member 395 is provided to separate between the adjacent light sources. The reflection member 395 reflects the light from the first LED element 381 or the second LED element 382 toward the wavelength conversion member 390. Thus, light that has reached the reflection member 395 without directly traveling to the corresponding wavelength conversion member 390 is also used as the irradiation light. Therefore, the utilization efficiency of the light source in the light source module 222 and in turn in the vehicle lamp 210 improves, and brighter light can be obtained or light of the same brightness can be obtained with less power consumption. In addition, since the reflection member 395 is provided to separate between the adjacent light sources, the light from the first LED element 381 in the first light source 351 can be prevented from becoming incident on the wavelength conversion member 390 of the second light source 352, and thus unintended light emission can be prevented. In a similar manner, the light from the second LED element 382 in the second light source 352 can be prevented from becoming incident on the wavelength conversion member 390 of the first light source 351, and thus unintended light emission can be prevented.

With the light source module 322 according to the present embodiment described thus far, an advantageous effect similar to the advantageous effect provided by the light source module 222 according to the third embodiment can be provided. In addition, with the light source module 322 according to the present embodiment, the wavelength conversion members of the respective light sources have the same configuration, and thus the configuration of the light source module 322 is relatively simple. Therefore, the processing cost for the light source module 322 can be reduced.

Fifth Embodiment

Figure 12:
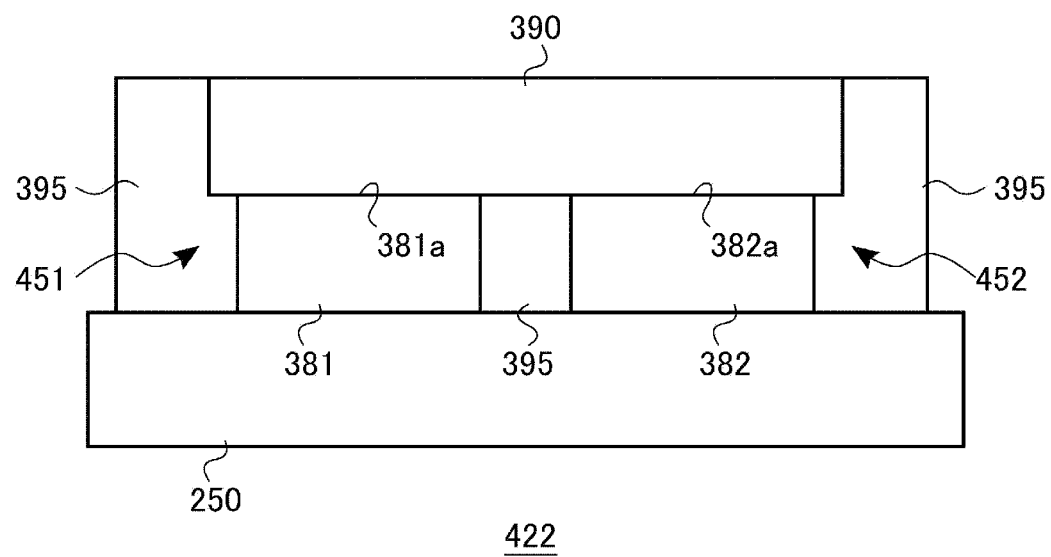
FIG. 12 is a schematic sectional view illustrating a light source module according to a fifth embodiment.

FIG. 12 is a schematic sectional view of a light source module 422 according to a fifth embodiment. FIG. 12 corresponds to FIG. 11. The light source module 422 includes a substrate 250, a first light source 451, a second light source 452, and a reflection member 395. The first light source 451 emits light at a correlated color temperature Tc1, and the second light source 452 emits light at a correlated color temperature Tc2 (>Tc1). In the present embodiment, the difference between the correlated color temperature of the irradiation light from the first light source 451 and the correlated color temperature of the irradiation light from the second light source 452 is no smaller than 500 K (i.e., (Tc2−Tc1)≥500 K).

A wavelength conversion member 390 of the first light source 451 and a wavelength conversion member 390 of the second light source 452 are formed integrally into a unit and oppose both an emission surface 381a of a first LED element 381 in the first light source 451 and an emission surface 382a of a second LED element 382 in the second light source 452.

With the light source module 422 according to the present embodiment described thus far, an advantageous effect similar to the advantageous effect provided by the light source module 322 according to the fourth embodiment can be provided.

Sixth Embodiment

Figure 13:
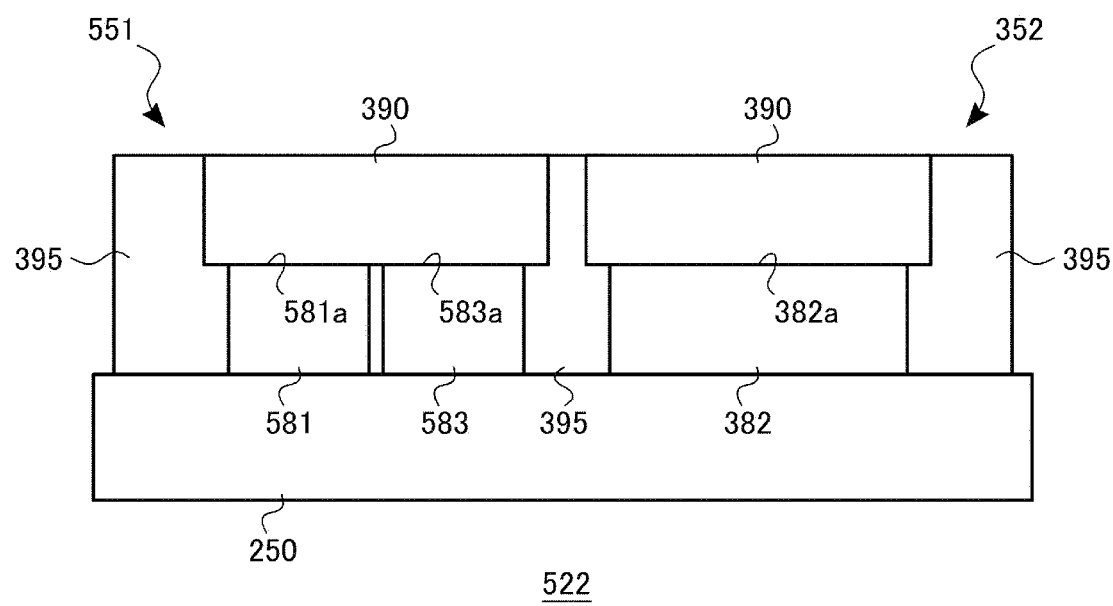
FIG. 13 is a schematic sectional view illustrating a light source module according to a sixth embodiment.

FIG. 13 is a schematic sectional view of a light source module 522 according to a sixth embodiment. FIG. 13 corresponds to FIG. 11. The light source module 522 includes a substrate 250, a first light source 551, a second light source 352, and a reflection member 395.

The first light source 551 includes a first LED element 581, a third LED element 583, and a wavelength conversion member 390. In other words, the first light source 551 includes two types of LED elements. The wavelength conversion member 390 is disposed in optical paths of the first LED element 581 and the third LED element 583. In the present embodiment, the wavelength conversion member 390 is disposed to oppose an emission surface 581a of the first LED element 581 and an emission surface 583a of the third LED element 583.

A portion of the light emitted by the first LED element 581 has its wavelength converted by the wavelength conversion member 390, and at least a portion of the remaining light emitted by the first LED element 581 is transmitted through the wavelength conversion member 390. Meanwhile, the light emitted by the third LED element 583 is substantially transmitted through the wavelength conversion member 390. For example, no less than 50% of the light emitted by the third LED element 583 may be transmitted.

White light having a correlated color temperature of Tc1 is generated from the light having its wavelength converted by the wavelength conversion member 390, the light from the first LED element 581 transmitted through the wavelength conversion member 390, and the light from the third LED element 583 substantially transmitted through the wavelength conversion member 390.

In one example, the first LED element 581 emits blue light having a dominant wavelength in a wavelength range of from 420 nm to 490 nm. The third LED element 583 emits amber-to-red light having a dominant wavelength in a wavelength range of from 577 nm to 700 nm.

The wavelength conversion member 390 converts a portion of the blue light emitted by the first LED element 581 to yellow light having a dominant wavelength in a wavelength range of from 560 nm to 568 nm and transmits at least a portion of the remaining blue light emitted by the first LED element 581. In addition, the wavelength conversion member 390 substantially transmits the amber-to-red light emitted by the third LED element 583. For example, the wavelength conversion member 390 may transmit no less than 50% of the amber-to-red light emitted by the third LED element 583.

Specifically, the wavelength conversion member 390 includes a phosphor. This phosphor absorbs a portion of the blue light emitted by the first LED element 581 to emit yellow light in a Lambertian manner. At least a portion of the remaining blue light emitted by the first LED element 581 exits from the wavelength conversion member 390 without being absorbed by the phosphor. The amber light emitted by the third LED element 583 exits from the wavelength conversion member 390 substantially without being absorbed by the phosphor (e.g., no less than 50% of the amber-to-red light remains unabsorbed by the phosphor). The amber-to-red light emitted by the third LED element 583 is in particular diffused by the wavelength conversion member 390 and exits from the wavelength conversion member 390.

The blue light transmitted through the wavelength conversion member 390 and the yellow light converted by the wavelength conversion member 390 are mixed, and white light is generated. In the present embodiment, the amber light transmitted through the wavelength conversion member 390 is further mixed into this white light. By varying the output of the amber light to be mixed into the white light, the correlated color temperature Tc1 of the white light can be varied.

With the light source module 522 according to the present embodiment described thus far, the first light source 551 and the second light source 352 are individually controlled, and the output of the light from each of the light sources is varied. Thus, the correlated color temperature of the white light can be adjusted.

Thus far, the configurations and the operations of the light source modules and the vehicle lamps according to the embodiments have been described. These embodiments are examples, and it should be appreciated by a person skilled in the art that various modifications can be made to the combinations of the constituent elements of the embodiments and that such modifications also fall within the scope of the present invention.

First Modification

In the first and second embodiments, a case in which the light source module 22 includes LED elements in a 2×4 matrix has been described, but this is not a limiting example. The light source module 22 may include a plurality of LED elements, and the plurality of LED elements may be arrayed in a matrix of m×1 (m is an integer no smaller than 2), 1×n (n is an integer no smaller than 2), or m×n (m and n are both integers no smaller than 2).

Second Modification

Although not particularly pointed out in the first and second embodiments, the wavelength conversion member may include a component having a refractive index different from that of the phosphor and may have a light-diffusing function. Thus, scattering of light in each color within the wavelength conversion member becomes more prominent, and the luminance unevenness and the color unevenness of the light emerging from the wavelength conversion member and in turn the light emitted from the light source module 22 are further reduced. In place of a component having a refractive index different from that of the phosphor or in addition to a component having a refractive index different from that of the phosphor, the wavelength conversion member may have concavities and convexities formed in the surface. A similar advantageous effect can also be obtained with the concavities and convexities in the surface.

Third Modification

In the first and second embodiments, a case in which the first LED elements 52 emit blue light and the wavelength conversion member includes the phosphor that absorbs a portion of the blue light to emit yellow light has been described, but this is not a limiting example. The first LED elements 52 may emit ultraviolet light, and the wavelength conversion member may include a phosphor that absorbs a portion of the ultraviolet light to emit blue light and another phosphor that absorbs at least a portion of the remaining ultraviolet light to emit yellow light. In this case, white light is generated by the blue light and the yellow light converted by the wavelength conversion member.

Fourth Modification

In the first and second embodiments, a case in which the traveling information S2 transmitted to the lamp control unit 72 includes the driving time, the vehicle speed, and the raining condition has been described, but this is not a limiting example. For example, the traveling information S2 may include information from a car navigation system. In this case, the lamp control unit 72 can determine, with ease, whether the vehicle is traveling on an expressway or traveling in a city area. In addition, for example, the traveling information S2 may include an image from a camera that captures the scene in front of the vehicle. In this case, the lamp control unit 72 can determine, on the basis of the image from the camera, whether the vehicle is traveling in a city area or traveling on an expressway.

Fifth Modification

In the third embodiment, a case in which the light source module 222 includes the single first light source 251, the two second light sources 252, and the single third light source has been described, but this is not a limiting example. The light source module 222 may include two or more first light sources 251. In addition, the light source module 222 may include a single second light source or three or more second light sources. Furthermore, the light source module 222 may include two or more third light sources 253. In other words, the number of the first light source 251, the number of the second light source 252, and the number of the third light source 253 are not limited as long as white light can be generated by the light from each light source and the correlated color temperature of the white light can be varied by varying the output of each light source.

This applies in a similar manner to the fourth to sixth embodiments.

Sixth Modification

In the third embodiment, a case in which the light source module 222 includes three types of light sources, namely, the first light source 251, the second light sources 252, and the third light source 253 has been described, but this is not a limiting example. The light source module may include two types of light sources that each emit light at a different correlated color temperature or four or more types of light sources that each emit light at a different correlated color temperature. In other words, the number of the types of light sources is not limited as long as white light can be generated by the light from a plurality of types of light sources that each emit light at a different correlated color temperature and the correlated color temperature of the white light can be varied by varying the output of each type of light source.

This applies in a similar manner to the fourth to sixth embodiments.

Seventh Modification

In the sixth embodiment, a case in which the first light source 551 includes one each of the first LED element 581 and the third LED element 583 has been described, but this is not a limiting example. The first light source may include a plurality of first LED elements 581 and/or a plurality of third LED elements 583. In addition, the second light source may be configured similarly to the first light source 551. In other words, the second light source may further include an LED element that emits light that is substantially transmitted through the wavelength conversion member 390.

Eighth Modification

Although not particularly pointed out in the third to sixth embodiments, the wavelength conversion member may include a light-diffusing function. Thus, scattering of light in each color within the wavelength conversion member becomes more prominent, and the luminance unevenness and the color unevenness of the light emerging from the wavelength conversion member and in turn the light emitted from the light source module 222 are reduced.

Ninth Modification

In the third to sixth embodiments, a case in which the traveling information S2 transmitted to the lamp control unit 272 includes the driving time, the vehicle speed, and the raining condition has been described, but this is not a limiting example, and the traveling information S2 may include other information. For example, the traveling information S2 may include information from a car navigation system. In this case, the lamp control unit 272 can determine, with ease, whether the vehicle is traveling on an expressway or traveling in a city area. In addition, for example, the traveling information S2 may include an image from a camera that captures the scene in front of the vehicle. In this case, the lamp control unit 272 can determine, on the basis of the image from the camera, whether the vehicle is traveling in a city area or traveling on an expressway.

What is claimed is:
1. A light source module, comprising:
  a first light-emitting element that emits light having a dominant wavelength in a first wavelength range;
  a second light-emitting element that emits light having a dominant wavelength in a second wavelength range;
  a wavelength conversion member disposed in optical paths of the first light-emitting element and the second light-emitting element;
  a reflection member that reflects a portion of the light from the first light-emitting element and the second light-emitting element not directly traveling to the wavelength conversion member toward the wavelength conversion member, wherein
  the wavelength conversion member converts a portion of the light having a dominant wavelength in the first wavelength range emitted by the first light-emitting element to light having a dominant wavelength in a third wavelength range, transmits a portion of the light having a dominant wavelength in the first wavelength range emitted by the first light-emitting element, and substantially transmits the light having a dominant wavelength in the second wavelength range emitted by the second light-emitting element.

2. The light source module according to claim 1, wherein the wavelength conversion member has a light-diffusing function.

3. The light source module according to claim 1, wherein the first light-emitting element and the second light-emitting element are disposed on the same substrate.

4. The light source module according to claim 1, wherein the first light-emitting element and the second light-emitting element are arrayed side by side, and an interval between the first light-emitting element and the second light-emitting element is no greater than one-half a smaller one of a width of the first light-emitting element in an array direction in which the first light-emitting element and the second light-emitting element are arrayed and a width of the second light-emitting element in the array direction.

5. A vehicle lamp, comprising:
the light source module according to claim 1; and
a driving circuit capable of individually controlling the first light-emitting element and the second light-emitting element of the light source module.

6. A light source module for a vehicle lamp, the light source module comprising:
a first light source including a first light-emitting element; and a first wavelength conversion member that is disposed in an optical path of the first light-emitting element, that converts a wavelength of a portion of light emitted by the first light-emitting element, and that transmits a portion of the light emitted by the first light-emitting element, and emits white light that is based on the light having the wavelength converted by the first wavelength conversion member and the light transmitted through the first wavelength conversion member;
a reflection member that reflects a portion of the light from the first light-emitting element not directly traveling to the first wavelength conversion member toward the first wavelength conversion member; and
a second light source that emits light at a correlated color temperature different from that of the first light source.

7. The light source module for a vehicle lamp according to claim 6, wherein
the second light source
includes a second light-emitting element; and a second wavelength conversion member that is disposed in an optical path of the second light-emitting element, that converts a wavelength of a portion of light emitted by the second light-emitting element, and that transmits a portion of the light emitted by the second light-emitting element, and
emits white light that is based on the light having the wavelength converted by the second wavelength conversion member and the light transmitted through the second wavelength conversion member,
the first wavelength conversion member includes a first phosphor,
the second wavelength conversion member includes a second phosphor,
the first light-emitting element and the second light-emitting element emit light having a substantially identical wavelength, and
there is a difference between at least one of a composition of the first phosphor and a composition of the second phosphor, a concentration of the first phosphor and a concentration of the second phosphor, an activator concentration of the first phosphor and an activator concentration of the second phosphor, and a thickness of the first wavelength conversion member and a thickness of the second wavelength conversion member.

8. The light source module for a vehicle lamp according to claim 6, wherein
the second light source
includes a second light-emitting element; and a second wavelength conversion member that is disposed in an optical path of the second light-emitting element, that converts a wavelength of a portion of light emitted by the second light-emitting element, and that transmits a portion of the light emitted by the second light-emitting element, and
emits white light that is based on the light having the wavelength converted by the second wavelength conversion member and the light transmitted through the second wavelength conversion member, and
the first light-emitting element and the second light-emitting element emit light having different wavelengths.

9. The light source module for a vehicle lamp according to claim 6, wherein
the first light source further includes a third light-emitting element that emits light having a wavelength different from that of the first light-emitting element, and
the first wavelength conversion member substantially transmits the light emitted by the third light-emitting element.

10. A vehicle lamp, comprising:
the light source module for a vehicle lamp according to claim 6;
a driving circuit capable of individually controlling the first light source and the second light source of the light source module; and
an optical system that directs a combined light-distribution pattern in which the light from the first light source and the light from the second light source are superposed on each other.

* * * * *